US011313736B2

(12) United States Patent
Perez

(10) Patent No.: US 11,313,736 B2
(45) Date of Patent: Apr. 26, 2022

(54) POWER SOURCE FOR A VEHICLE SERVICE CART

(71) Applicant: Safran Passenger Innovations, LLC, Brea, CA (US)

(72) Inventor: Victor Arino Perez, Munich (DE)

(73) Assignee: Safran Passenger Innovations, LLC, Brea, CA (US)

( * ) Notice: Subject to any disclaimer, the term of this patent is extended or adjusted under 35 U.S.C. 154(b) by 46 days.

(21) Appl. No.: 15/919,115

(22) Filed: Mar. 12, 2018

(65) Prior Publication Data
US 2018/0266895 A1 Sep. 20, 2018

Related U.S. Application Data
(60) Provisional application No. 62/472,245, filed on Mar. 16, 2017.

(51) Int. Cl.
| G01K 11/06 | (2006.01) |
|---|---|
| F25D 23/06 | (2006.01) |
| F25D 11/00 | (2006.01) |
| H01L 35/28 | (2006.01) |
| A47B 31/06 | (2006.01) |
| B64D 11/00 | (2006.01) |

(Continued)

(52) U.S. Cl.
CPC .............. *G01K 11/06* (2013.01); *A47B 31/06* (2013.01); *B60P 3/0257* (2013.01); *B64D 11/0007* (2013.01); *F25B 21/02* (2013.01); *F25D 3/125* (2013.01); *F25D 11/003* (2013.01); *F25D 23/063* (2013.01); *H01L 35/28* (2013.01); *F25D 3/06* (2013.01)

(58) Field of Classification Search
CPC .......... F25D 11/003; F25D 3/125; F25D 3/06; H01L 35/28; B64D 11/0007; B60P 3/0257
USPC ........................................... 62/177, 178, 183
See application file for complete search history.

(56) References Cited

U.S. PATENT DOCUMENTS 3,733,836 A * 5/1973 Corini ..................... F25B 21/02
62/3.61
7,444,830 B2 11/2008 Moran et al.
(Continued)

FOREIGN PATENT DOCUMENTS

| AU | 2014201741 | 10/2014 |
| AU | 2014201741 A1 | 10/2014 |

(Continued)

OTHER PUBLICATIONS

Yildiz et al., Low Power Energy Harvesting with a Thermoelectric Generator through an Air Conditioning Condenser, 360 Degree of Engineering Education, Paper ID# 10552, American Society for Engineering Education, 2014.

(Continued)

Primary Examiner — Brian M King
(74) Attorney, Agent, or Firm — Umberg Zipser LLP; Ryan Dean

(57) ABSTRACT

Systems and methods are disclosed of a service cart for an aircraft or other vehicle, which includes a thermoelectric device capable of generating a current as a result of a temperature differential between a cold compartment of the cart and an ambient environment. The current can be either stored in a battery or other storage device, and used to power one or more electronic components associated with the cart.

8 Claims, 3 Drawing Sheets

(51) Int. Cl.
*B60P 3/025* (2006.01)
*F25D 3/12* (2006.01)
*F25B 21/02* (2006.01)
*F25D 3/06* (2006.01)

(56) References Cited

U.S. PATENT DOCUMENTS

| | | | |
|---|---|---|---|
| 9,303,912 B1 | 4/2016 | Schalla et al. | |
| 10,211,385 B2* | 2/2019 | Crispin | H01L 37/00 |
| 10,305,013 B2* | 5/2019 | Kang | H01G 9/21 |
| 10,396,263 B2* | 8/2019 | Lee | H01L 35/32 |
| 2006/0061243 A1 | 3/2006 | Loon et al. | |
| 2009/0031750 A1* | 2/2009 | Whillock, Sr. | F25B 21/02 62/344 |
| 2012/0204577 A1* | 8/2012 | Ludwig | F25B 21/04 62/3.3 |
| 2012/0312030 A1* | 12/2012 | Lu | F25D 11/00 62/3.6 |
| 2013/0192655 A1* | 8/2013 | Edwards | H05K 1/0203 136/204 |
| 2014/0157794 A1* | 6/2014 | McGann | F25B 21/04 62/3.2 |
| 2015/0075186 A1* | 3/2015 | Prajapati | F25B 21/02 62/3.7 |
| 2015/0168032 A1* | 6/2015 | Steele | B60P 3/20 62/61 |
| 2017/0042373 A1* | 2/2017 | Alexander | A47J 36/2494 |
| 2017/0067682 A1* | 3/2017 | Spinks | F25D 23/12 |
| 2020/0028051 A1* | 1/2020 | Sugiura | C01B 32/159 |

FOREIGN PATENT DOCUMENTS

| | | |
|---|---|---|
| JP | H05215455 A | 8/1993 |
| JP | 05-215455 | 10/1993 |
| JP | 2008-025920 | 2/2008 |
| JP | 2010510121 A | 4/2010 |
| JP | 5215455 B2 | 6/2013 |
| JP | 2013532084 A | 8/2013 |
| JP | 2014-105987 | 6/2014 |
| WO | 2004071239 A1 | 8/2004 |
| WO | 2011119981 A1 | 9/2011 |
| WO | 2012056086 A1 | 5/2012 |

OTHER PUBLICATIONS

European Patent Office, Extended European Search Report, dated Nov. 13, 2020.
Monika Bauer, "Intelligentes Catering mit RFID", Jan. 11, 2011, XP055197841, Retrieved from the Internet: URL:http://research.iao.fraunhofer.de/ebusiness/download/index.php?request=2010 Intelligentes Catering mit RFID.
Japan Patent Office, Office Action, dated Dec. 21, 2021.

* cited by examiner

POWER SOURCE FOR A VEHICLE SERVICE CART

This application claims priority to U.S. provisional patent application having Ser. No. 62/472,245 filed on Mar. 16, 2017. This and all other referenced extrinsic materials are incorporated herein by reference in their entirety. Where a definition or use of a term in a reference that is incorporated by reference is inconsistent or contrary to the definition of that term provided herein, the definition of that term provided herein is deemed to be controlling.

FIELD OF THE INVENTION

The field of the invention is service trolleys and carts for use in transporting and serving food and beverages, and particularly such service carts for use in passenger aircraft or other vehicles.

BACKGROUND

The background description includes information that may be useful in understanding the present invention. It is not an admission that any of the information provided herein is prior art or relevant to the presently claimed invention, or that any publication specifically or implicitly referenced is prior art.

It is increasingly common for commercial passenger aircraft to incorporate integrated information systems, such as described in Australian Patent Application No. 2014201741 (to O'Sullivan and Shedden). Such systems typically include a server that collects data from and helps to coordinate various aircraft systems, including the galley. While such systems serve to improve efficiency and streamline operations, collection of data from elements within the aircraft (particularly mobile elements) can be challenging, in part because of the power and space requirements required for data collection and transmission from items that are generally designed to minimize both weight and bulk.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

On commercial passenger aircraft, trolleys or carts are frequently used to transport food and beverages from the galley area to individual passengers. Such service carts typically do not rely on mechanical or electronic refrigeration to maintain low temperatures, as the heavy power supplies required are not compatible with the desire to minimize weight and bulk of such devices. Rather, aircraft food and beverage service trolleys typically utilize water and/or $CO_2$ ice in combination with insulation to maintain low internal temperatures. An example of such a trolley can be found in U.S. Pat. No. 7,444,830, to Moran and Rood. In lacking conventional sources of stored power, however, such trolleys are poorly suited for incorporation of electronics suitable for use with aircraft information systems without the addition of significant weight and bulk.

Thus, there is still a need for providing a lightweight and compact source of power suitable for use with electronic devices in food and beverage service trolleys and carts.

SUMMARY OF THE INVENTION

The inventive subject matter provides apparatus, systems and methods in which a thermoelectric device is provided that utilizes the temperature difference between the interior of an insulated food and beverage service cart or trolley (which is typically cooled at least in part by phase changes in water and/or $CO_2$ ice) and the relatively warm ambient environment to generate electrical power. The electrical power that is generated can then be used to power electronic equipment, or used to charge a light weight storage device (for example, a supercapacitor) that is subsequently used to power electronic equipment. In a preferred embodiment of the inventive concept, the thermoelectric device is a Peltier device that utilizes the Peltier-Seebeck effect to generate an electric current in response to a temperature differential.

Although the below discussion focuses on carts or trolleys, it is contemplated that the inventive subject matter discussed herein could be used in apparatus having similar properties or functions and that permits energy harvesting using a Peltier device, for example. Further, while the below discussion focuses on aircraft, it is contemplated that the inventive subject herein could be utilized in busses, trains, boats, and other vehicles, as well as free-standing structures or other locations where concessions may be served.

Various objects, features, aspects and advantages of the inventive subject matter will become more apparent from the following detailed description of preferred embodiments, along with the accompanying drawing figures in which like numerals represent like components.

DETAILED DESCRIPTION

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

One should appreciate that the disclosed techniques provide many advantageous technical effects including providing a compact and lightweight source of electrical power to a food and beverage service cart or trolley without compromising its primary functions and features.

Figure 1:
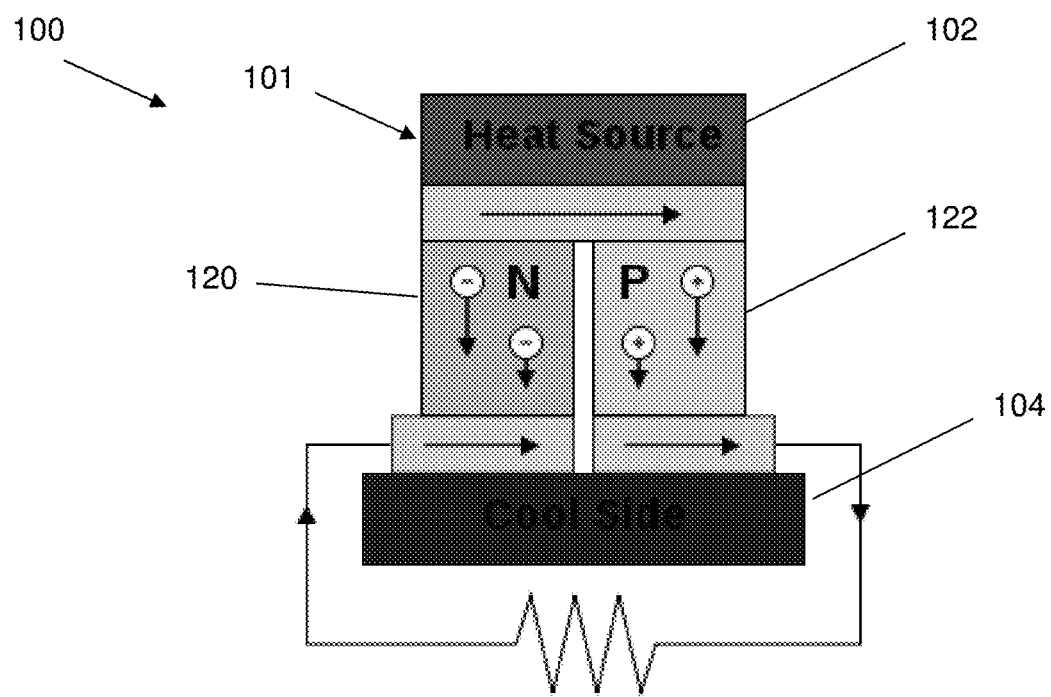
FIG. 1 illustrates one embodiment of a Peltier element of a thermoelectric device.

In a preferred embodiment of the inventive concept the thermoelectric (TE) device 100 includes a Peltier element 101 that utilizes the Peltier-Seebeck effect, such as that shown in FIG. 1, to generate electrical power. The Peltier element 101 includes two or more elements of n-type and p-type doped semiconductor material, 120, 122, respectively, which are connected electrically in series and thermally in parallel. These thermoelectric elements 120, 122 and their electrical interconnects are typically mounted between two ceramic substrates that act as a structure for the device 100 and electrically insulate the elements 120, 122 from one another and from external mounting surfaces.

In embodiments of the inventive concept, the cool side 104 of such a device 100 would be placed in thermal communication with an interior of an insulated interior space of a food and beverage service cart, such as shown in FIG. 3, while the heat source side 102 would be in thermal communication with the ambient environment. When used in such a combination, the device 100 acts as a small heat pump, moving heat from one side of the device 100 to the other.

Figure 2:
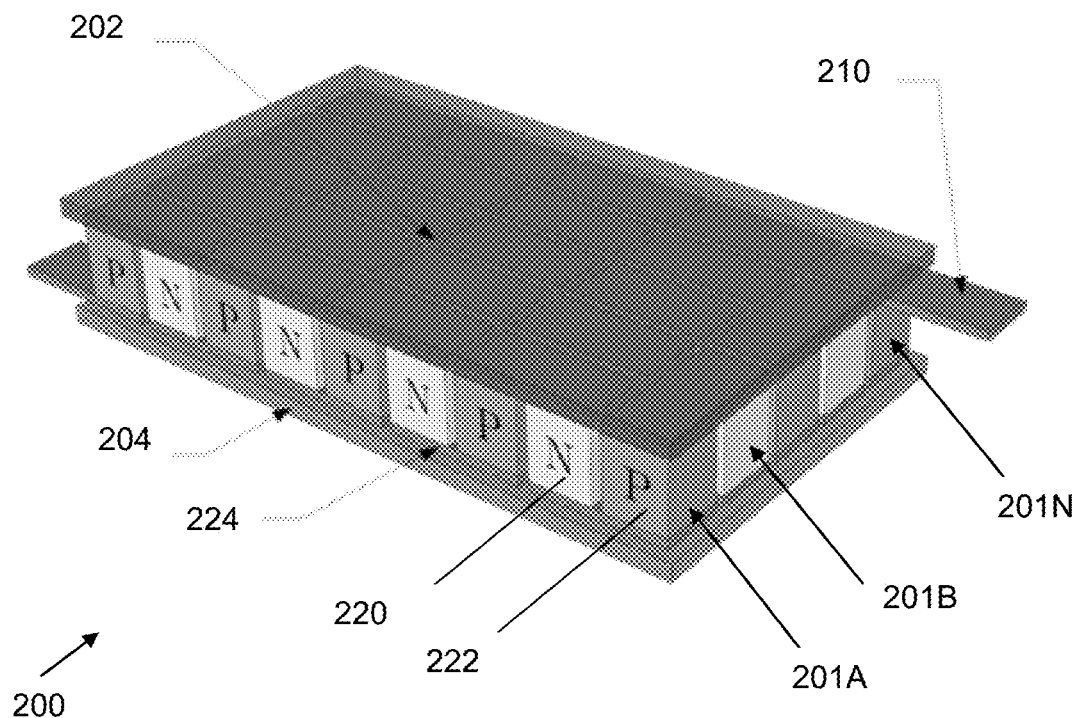
FIG. 2 illustrates one embodiment of a multiple-Peltier element thermoelectric device.

It should be appreciated that multiple Peltier elements 201A, 201B . . . 201N can be assembled in a single thermoelectric device 200, as shown in FIG. 2, in order to improve efficiency and/or power generating capacity. Like the element in FIG. 1, the multiple Peltier elements 201A, 201B . . . 201N can be arranged such that a cool side of such the device 200 would be placed in thermal communication with an interior of an insulated interior space of a food and beverage service cart, while the warm or hot side would be in thermal communication with the ambient environment.

Each of the elements 201A, 201B . . . 201N includes two or more elements of n-type and p-type doped semiconductor material, 220, 222, respectively, which are connected electrically by an interconnect 224. The elements 201A, 201B . . . 201N are mounted between two ceramic substrates 202 and 204, with substrate 202 facing the "hot" side and substrate 204 facing the "cool" side.

The device 200 can include an electrical connection 210 through which current generated by the device 200 can be sent to battery or other storage device, for example.

Figures 3A, 3B:
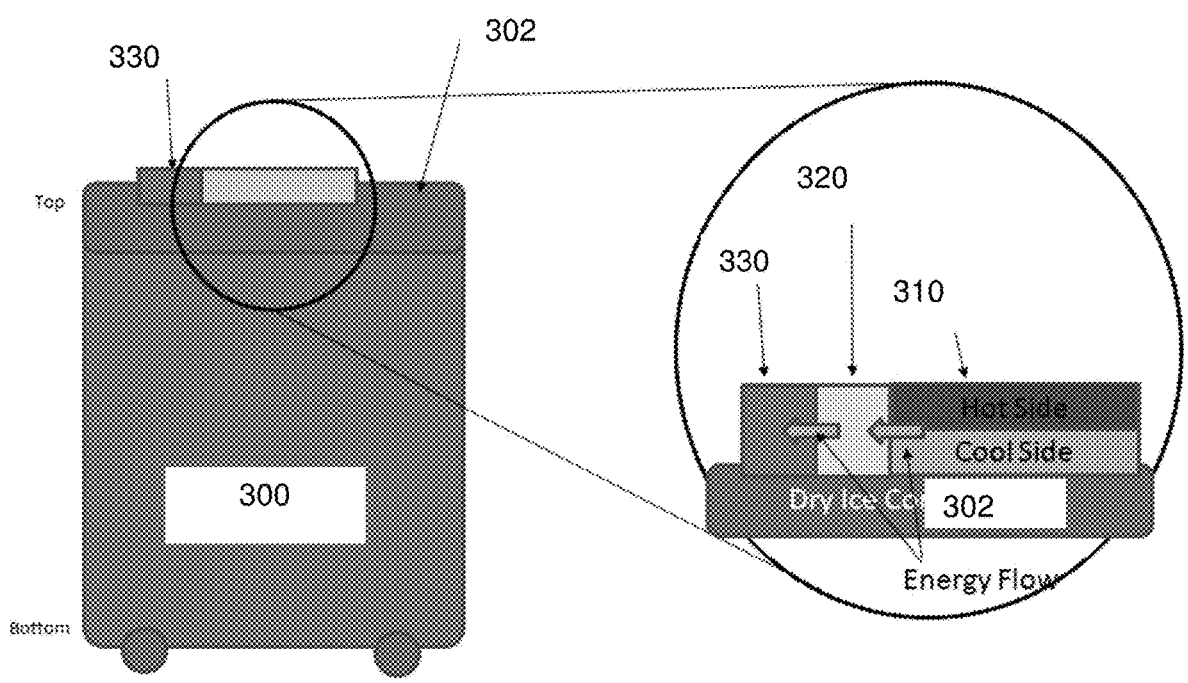
FIG. 3A illustrates one embodiment of a food and beverage cart of the inventive concept.
FIG. 3B illustrates an enlarged view of a portion of the cart of FIG. 3A.

FIGS. 3A-3B shows an example of a food and beverage service cart 300 of the inventive concept. As shown, the food and beverage cart 300 includes a cold compartment 302, which in some embodiments can contain dry ice and provide cooling for the interior of the cart 300 through sublimation of $CO_2$ ice. The large temperature differential between the cold compartment 302 and the ambient environment used by thermoelectric device 310 that incorporates one or more Peltier elements, such as that shown in FIG. 2, advantageously provides a lightweight source of electrical energy.

The cold compartment 302 is preferably an insulated interior space of the cart 300, which is maintained at a reduced temperature that is at least 5° C. below that of the ambient environment. Such space can be a cabinet or compartment of the trolley/cart 300. In other embodiments, the insulated interior space can be a separate, removable enclosure that is supported by the trolley/cart 300. The reduced temperature can be provided by the inclusion of a low-temperature material, such as water or $CO_2$ ice, within the cold compartment 302. Melting and/or sublimation of such water or $CO_2$ ice within the cold compartment 302 maintains the reduced temperature. Alternatively, the reduced temperature can be provided by chilling the trolley/cart 300 or a portion thereof, such as while the trolley/cart 300 is locked in place in the aircraft, or prior to being moved to the aircraft from a remote location. In some embodiments the cold compartment 302 can include components that serve as heat reservoirs (for example, phase change materials) to enhance the effect of such chilling.

The thermoelectric device 310 is preferably in thermal communication with both the cold compartment 302 and the ambient environment. Such thermal communication can be direct, for example by direct contact of at least a portion of the thermoelectric device 310 with the cold compartment 302 (for example, by integration into a portion of a wall of the cold compartment 302). Alternatively, thermal communication with the thermoelectric device 310 can be indirect. Such indirect thermal communication can be passive, for example thermal communication provided by thermally conductive materials placed between the interior of the cold compartment 302 and the thermoelectric device 310 and/or between the ambient environment and the thermoelectric device 310. In other embodiments indirect thermal communication can be active, for example through the provision of devices such as heat pipes.

A thermoelectric device suitable for use in the inventive concept are capable of generating electrical energy from a temperature differential of 5° C. or more, and preferably from a temperature differential of from about 5° C. to about 20° C. or more. Suitable thermoelectric devices can be solid state devices, such as a Peltier element or thermocouple. Alternatively, suitable thermoelectric devices can include mechanical elements, such as a Sterling engine in combination with a generator.

In some embodiments, the service trolley or cart 300 can include a lightweight energy storage device 320 that is in electrical communication with the thermoelectric device 310. Such an energy storage device 320 advantageously permits the accumulation of electrical power from the thermoelectric device 310 for an extended period of time, which can in turn be expended rapidly by a high drain electronic device (such as a near field, RF, and/or Bluetooth transmitter). Thus, energy generated from the device 310 can be provided via an electrical connection to the device 320.

Suitable lightweight energy storage devices include lightweight batteries, capacitor banks, and supercapacitors. In a preferred embodiment, the energy storage device is a supercapacitor that is in electrical communication with the thermoelectric device 310 for purposes of charging and with an electronic device 320 that utilizes the stored electrical energy.

The continuous generation of electrical power advantageously permits the use of a relatively small and lightweight storage device for such power, as it is continuously replenished as the service cart is in use. The stored electrical power can in turn be utilized to power electronic devices 330 associated with the food and beverage service cart, such as powering sensors and a transceiver to provide updated status information about the cart to a central server. Such information could include a temperature inside one or more compartments of the cart, sales information for purchased product, an inventory of products within the cart, and so forth.

As noted above, electrical power generated from such thermoelectric devices can be utilized by one or more electronic devices associated with a food and beverage service cart. Such electronics can, for example, be utilized to record or monitor transactions (such as a point of sales device), read RFID chips, read magnetic strips of debit/credit cards, monitor and/or report inventory, and/or transmit and receive information from an on-board server. In some embodiments the electronic device can include a near field, WiFi, RF, and/or Bluetooth transceiver.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Unless the context dictates the contrary, all ranges set forth herein should be interpreted as being inclusive of their endpoints and open-ended ranges should be interpreted to include only commercially practical values. Similarly, all lists of values should be considered as inclusive of intermediate values unless the context indicates the contrary.

The recitation of ranges of values herein is merely intended to serve as a shorthand method of referring individually to each separate value falling within the range. Unless otherwise indicated herein, each individual value with a range is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . . and N, the text should be interpreted as requiring only one element from the group, not A plus N, or B plus N, etc.

What is claimed is:

1. A portable service cart for an aircraft or other vehicle that generates electrical energy from a temperature differential between the cool interior of the service cart and the warmer ambient environment, comprising:

an interior space having a temperature that is at least 5° C. below a temperature of an ambient environment due to ice composed of water or $CO_2$ that is disposed within the interior space;

a thermoelectric device comprising a first substrate and a second substrate, and two or more elements of n-type and p-type doped semiconductor material disposed between the first substrate and the second substrate, wherein the first substrate is exposed to the warmer ambient environment and the second substrate is coupled to the cooler interior space such that the thermoelectric device is in thermal communication with both the cooler interior space and the warmer ambient environment; and an electronic device electrically coupled to the thermoelectric device, and selected from the group consisting of a point of sale device, an RFID reader, a magnetic strip reader, and a wireless transceiver;

wherein, during operation, the thermoelectric device generates a current to power the electronic device, and wherein the current is generated by utilizing a Seebeck effect from a temperature gradient between the cooler temperature of the interior space and the warmer temperature of the ambient environment by moving heat from the warmer ambient environment to the cooler interior space.

2. The service cart of claim 1, further comprising an energy storage device that is in electrical communication with the thermoelectric device and with the electronic device, and wherein the energy storage device is configured to store at least some of the current generated by the thermoelectric device for use in powering the electronic device.

3. The service cart of claim 2, wherein the energy storage device is selected from the group consisting of a battery, a capacitor, and a supercapacitor.

4. The service cart of claim 1, wherein the interior space comprises an insulated space compatible with ice composed of water or $CO_2$.

5. The service cart of claim 1, wherein the temperature of the interior space is between 5° C. to 20° C. below the temperature of the ambient environment.

6. A portable service cart for an aircraft or other vehicle that generates electrical energy from a temperature differential between the cool interior storage space of the service cart and the warmer ambient environment, having at least one electronic component selected from the group consisting of a point of sale device, an RFID reader, a magnetic strip reader, and a wireless transceiver, comprising:

an interior storage space having a first compartment configured to receive ice composed of water or $CO_2$, such that the interior storage space has a temperature that is 5° C. to 20° C. below a temperature of an ambient environment;

wherein the service cart comprises a second compartment configured to store a plurality of service products;

a thermoelectric device comprising a first substrate and a second substrate, and two or more elements of n-type and p-type doped semiconductor material disposed between the first substrate and the second substrate, wherein the thermoelectric device is disposed on the service cart such that the second substrate is in thermal communication with the cooler first compartment of the interior storage space and the first substrate is in communication with the warmer ambient environment, and wherein the thermoelectric device is configured, during operation, to generate a current by utilizing a temperature gradient between the below ambient temperature of the first compartment and the warmer temperature of the ambient environment by moving heat from the warmer ambient environment to the cooler interior storage space; and an energy storage device that is in electrical communication with the thermoelectric device, and configured to store at least some of the current generated by the thermoelectric device;

the at least one electronic component being electrically coupled with the thermoelectric device or the energy storage device;

wherein the current generated by the thermoelectric device powers the at least one electronic component.

7. The service cart of claim 6, wherein the electronic device is electrically coupled to the energy storage device, and wherein the electronic device is powered by the energy store device.

8. The service cart of claim 6, wherein the energy storage device is selected from the group consisting of a battery, a capacitor, and a supercapacitor.

\* \* \* \* \*